(12) United States Patent
Strassburg et al.

(10) Patent No.: US 9,281,413 B2
(45) Date of Patent: Mar. 8, 2016

(54) ENHANCEMENT MODE DEVICE

(71) Applicant: Infineon Technologies Austria AG, Villach (AT)

(72) Inventors: Matthias Strassburg, Klagenfurt (AT); Gerhard Prechtl, Rosegg (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/165,785

(22) Filed: Jan. 28, 2014

(65) Prior Publication Data

US 2015/0214352 A1 Jul. 30, 2015

(51) Int. Cl.
| | | |
|---|---|---|
| *H01L 29/788* | (2006.01) | |
| *H01L 29/16* | (2006.01) | |
| *H01L 29/205* | (2006.01) | |
| *H01L 29/423* | (2006.01) | |
| *H01L 29/51* | (2006.01) | |
| *H01L 29/778* | (2006.01) | |
| *H01L 29/20* | (2006.01) | |

(52) U.S. Cl.
CPC .......... *H01L 29/788* (2013.01); *H01L 29/1608* (2013.01); *H01L 29/205* (2013.01); *H01L 29/42324* (2013.01); *H01L 29/51* (2013.01); *H01L 29/513* (2013.01); *H01L 29/7786* (2013.01); *H01L 29/7787* (2013.01); *H01L 29/7881* (2013.01); *H01L 29/2003* (2013.01); *H01L 29/518* (2013.01)

(58) Field of Classification Search
CPC ................ H01L 21/339; H01L 21/775; H01L 21/823406; H01L 21/2026; H01L 27/1055; H01L 27/12; H01L 29/788

USPC .................................. 438/148, 264; 257/321
See application file for complete search history.

(56) References Cited

U.S. PATENT DOCUMENTS

| | | | |
|---|---|---|---|
| 5,138,410 A | 8/1992 | Takebuchi | |
| 5,739,569 A | 4/1998 | Chen | |
| 7,723,752 B2 | 5/2010 | Yoshida et al. | |
| 7,859,019 B2 | 12/2010 | Suzuki et al. | |
| 8,153,491 B2 | 4/2012 | Lue et al. | |
| 8,183,595 B2 | 5/2012 | Briere | |
| 8,350,296 B2 | 1/2013 | Bahramian | |
| 8,861,273 B2* | 10/2014 | Lue | 365/185.17 |
| 2002/0031920 A1* | 3/2002 | Lyding et al. | 438/795 |
| 2005/0141281 A1* | 6/2005 | Jung | 365/185.23 |
| 2007/0278563 A1* | 12/2007 | Takano et al. | 257/324 |
| 2008/0067577 A1 | 3/2008 | Wang et al. | |
| 2008/0128788 A1* | 6/2008 | Baek et al. | 257/321 |
| 2010/0044751 A1 | 2/2010 | Bahramian | |
| 2011/0070726 A1* | 3/2011 | Dickenscheid et al. | 438/591 |
| 2012/0019284 A1 | 1/2012 | Mauder et al. | |

OTHER PUBLICATIONS

Lee, B., et al. "Normally-Off AlGaN/GaN-on-Si MOSHFETs with TaN Floating Gates and ALD SiO2 Tunnel Dielectrics." 2010 IEEE International Electron Devices Meeting, Dec. 6-8, 2010, pp. 20.6.1-20.6.4, San Francisco, CA.
Pavan, P., et al. "Flash Memory Cells—An Overview." Proceedings of the IEEE, Aug. 1997, pp. 1248-1271, vol. 85, No. 8.

* cited by examiner

*Primary Examiner* — Phuc Dang
(74) *Attorney, Agent, or Firm* — Murphy, Bilak & Homiller, PLLC

(57) ABSTRACT

An enhancement mode device includes a floating gate structure. The floating gate structure includes a first bottom dielectric layer, a second bottom dielectric layer on the first bottom dielectric layer and a conductive floating gate on the second bottom dielectric layer.

23 Claims, 3 Drawing Sheets

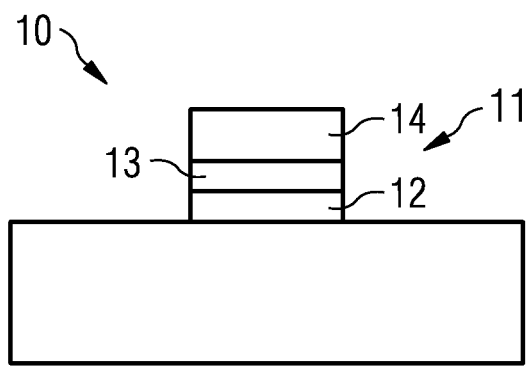
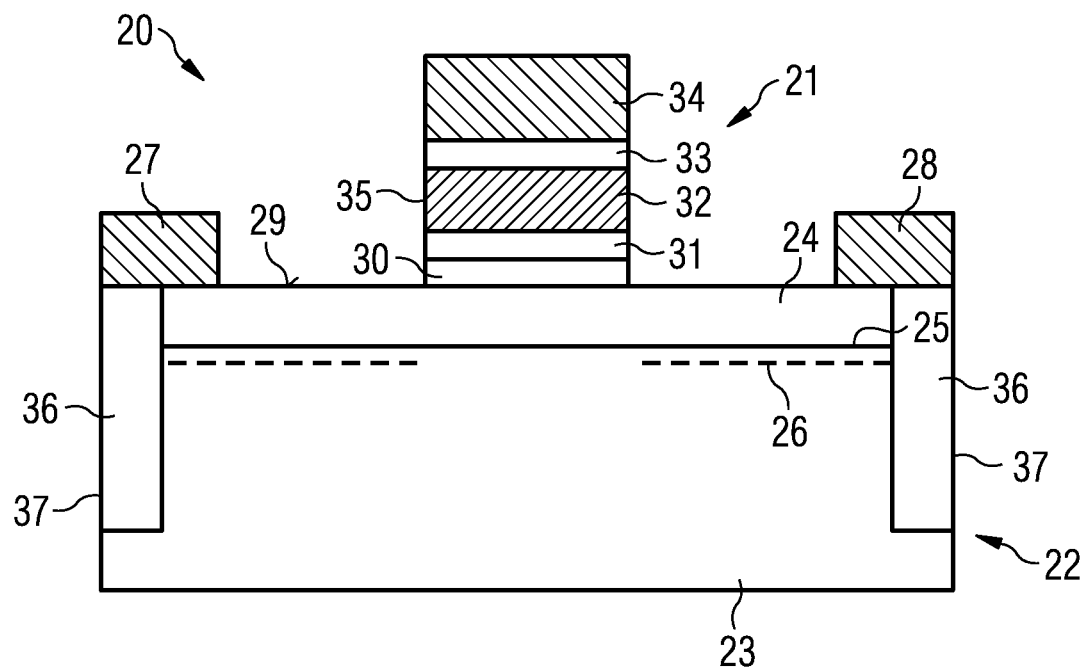

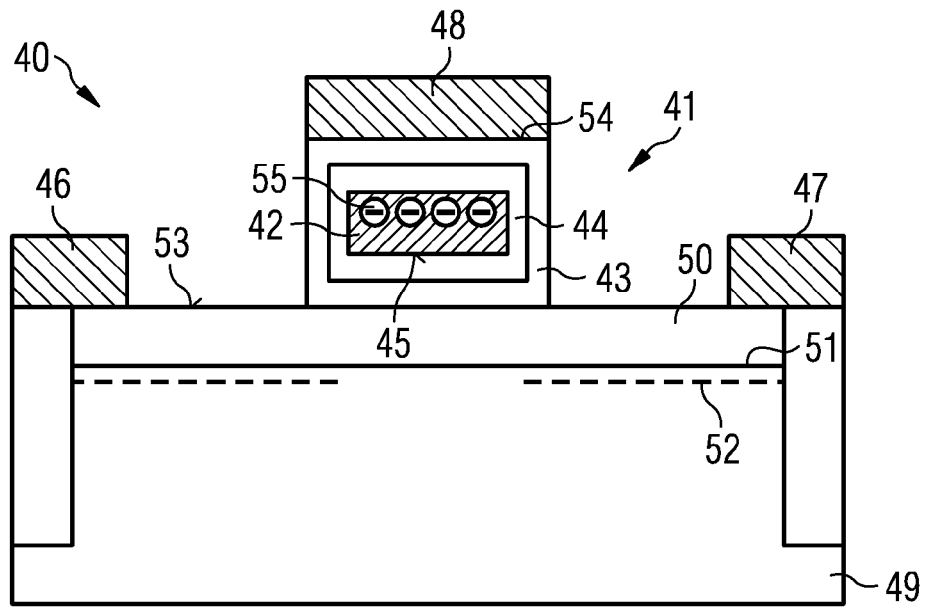
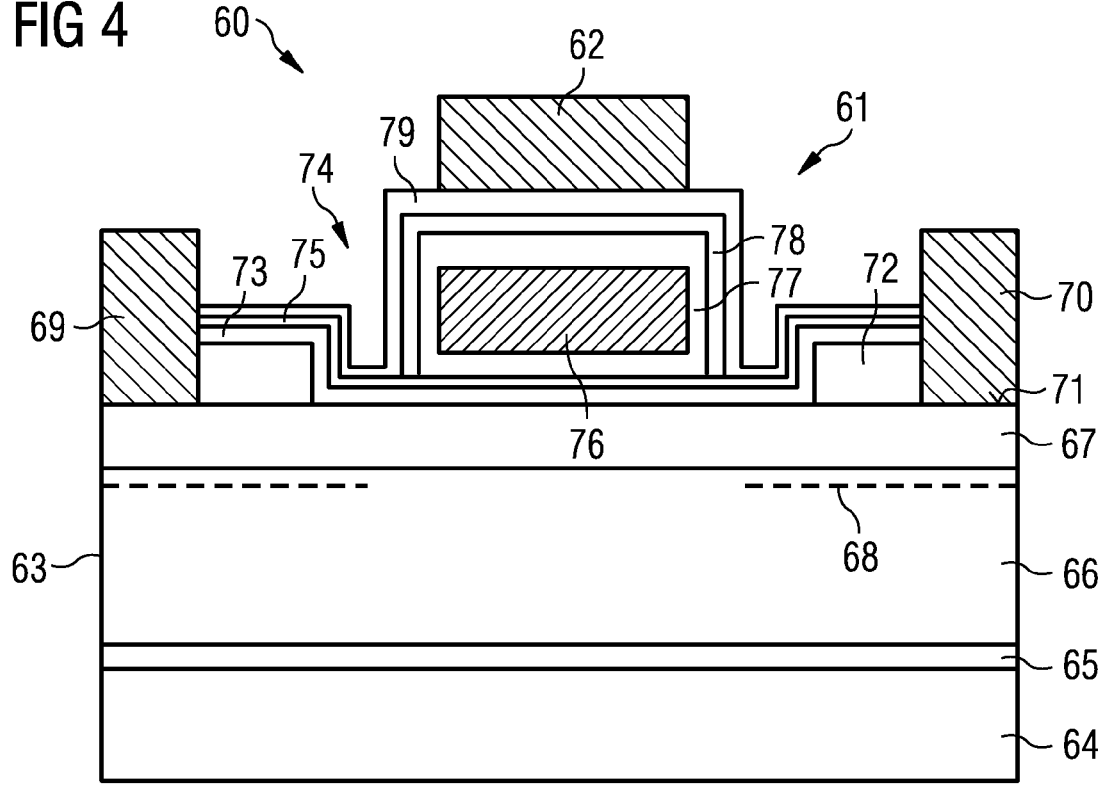

ENHANCEMENT MODE DEVICE

BACKGROUND

To date, transistors used in power electronic applications have typically been fabricated with silicon (Si) semiconductor materials. Common transistor devices for power applications include Si CoolMOS, Si Power MOSFETs, and Si Insulated Gate Bipolar Transistors (IGBTs). More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times.

SUMMARY

In an embodiment, an enhancement mode device includes a floating gate structure. The floating gate structure includes a first bottom dielectric layer, a second bottom dielectric layer on the first bottom dielectric layer and a conductive floating gate on the second bottom dielectric layer.

In an embodiment, an enhancement mode transistor device includes a Group III-nitride-based channel layer, a Group III-nitride-based barrier layer arranged on the Group III-nitride-based channel layer and forming a heterojunction therebetween, a source, a drain, a control gate and a floating gate structure. The source, the drain and the control gate are arranged on the barrier layer and the floating gate structure is arranged between the control gate and the barrier layer. The floating gate structure includes a first bottom dielectric layer, a second bottom dielectric layer on the first bottom dielectric layer and a conductive floating gate on the second bottom dielectric layer.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1 illustrates an enhancement mode device according to a first embodiment.

FIG. 2 illustrates an enhancement mode transistor device according to a second embodiment.

FIG. 3 illustrates an enhancement mode transistor device according to a third embodiment.

FIG. 4 illustrates a gallium nitride-based enhancement mode transistor device according to a fourth embodiment.

DETAILED DESCRIPTION

Figure 5:
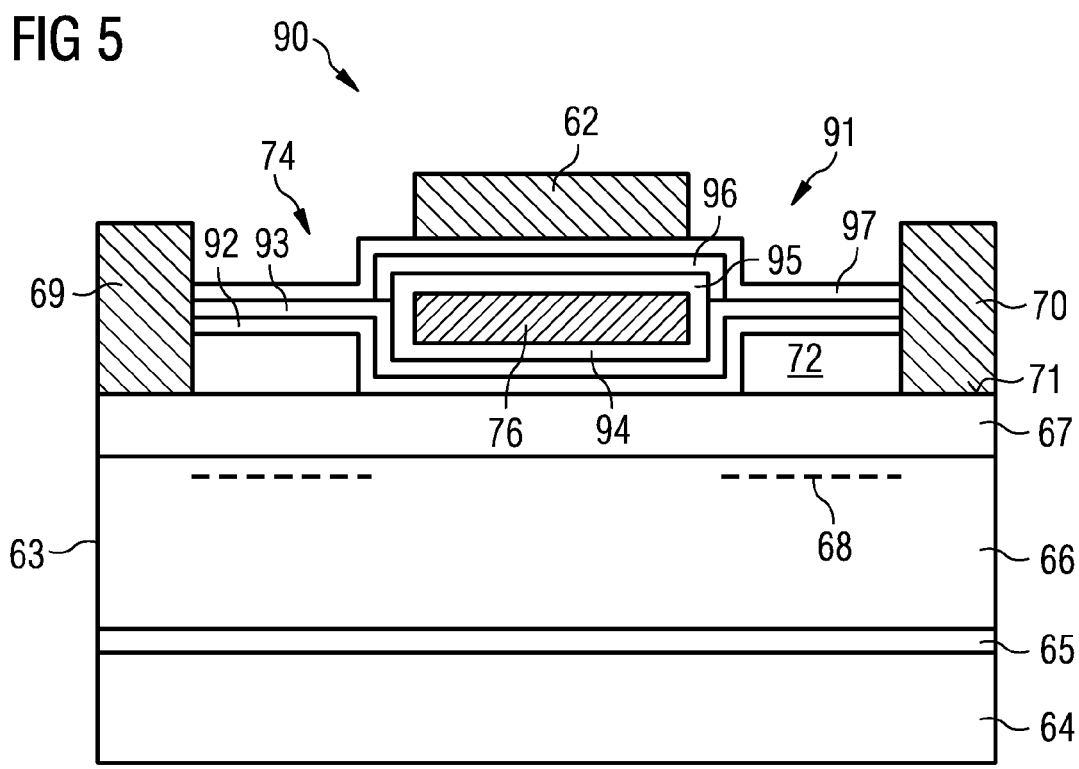
FIG. 5 illustrates a gallium nitride-based enhancement mode transistor device according to a fifth embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

A depletion-mode device, such as a high-voltage depletion-mode transistor, has a negative threshold voltage which means that it can conduct current at zero gate voltage. These devices are normally on. An enhancement-mode device, such as a low-voltage enhancement-mode transistor, has a positive threshold voltage which means that it cannot conduct current at zero gate voltage and is normally off.

As used herein, the phrase "Group III-Nitride" refers to a compound semiconductor that includes nitrogen (N) and at least one group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aP_bN_{(1-a-b)}$), for example. Aluminum gallium nitride refers to an alloy described by the formula $Al_xGa_{(1-x)}N$, where x<1.

FIG. 1 illustrates an enhancement mode device 10 according to a first embodiment that includes a floating gate structure 11. The floating gate structure 11 includes a first bottom dielectric layer 12, a second bottom dielectric layer 13 on the first bottom dielectric layer 12, and a conductive floating gate 14 on the second bottom dielectric layer 13.

The enhancement mode device 10 may be a semiconductor device such as an enhancement mode transistor device or an enhancement mode diode device. The enhancement mode transistor device may be a compound semiconductor device such as a Group III-Nitride-based transistor device or a silicon carbide transistor device.

The first bottom dielectric layer 12 may be arranged on an active semiconductor region of the enhancement mode device 10. The first bottom dielectric layer 12 and the second bottom dielectric 13 may include different bandgap energies. For example, the bandgap energy of the first bottom dielectric layer 12 may be greater than the bandgap energy of the second bottom dielectric layer 13.

The floating gate structure 11 may include more than two bottom dielectric layers. In an embodiment, the enhancement mode device 10 further includes at least one further bottom dielectric layer arranged between the second bottom dielectric layer 13 and the conductive floating gate 14.

The enhancement mode device 10 may include at least one insulating layer arranged on the conductive floating gate 14.

The enhancement mode device 10 may further include a control gate arranged on the insulating layer. The insulating layer may be a single layer or may include two or more layers. In an embodiment, the insulating layer includes at least a first top dielectric layer and a second top dielectric layer. The first top dielectric layer and the second top dielectric layer may have different bandgap energies.

The conductive floating gate 14 may be encapsulated. For example, the conductive floating gate 14 may be encapsulated by the first bottom dielectric layer and by the second bottom dielectric layer. The conductive floating gate may be encapsulated by the first top dielectric layer and the second top dielectric layer. At least side faces of the conductive floating gate may be covered by at least one side dielectric layer. The at least one side dielectric layer may be combined with the first bottom dielectric layer and the second bottom dielectric layer and/or with the first top layer and second top layer, for example.

The first bottom dielectric layer may be selected from the group consisting of $SiO_x$, $SiN_x$ and $SiO_xN_y$. The second bottom dielectric layer may be selected from the group consisting of $SiO_x$, $SiN_x$ and $SiO_xN_y$. For example, if the first bottom dielectric layer includes $SiO_x$, the second bottom dielectric layer may include $SiN_x$ or vice versa. If first and second top dielectric layers are provided, the first top dielectric layer may be selected from the group consisting of $SiO_x$, $SiN_x$ and $SiO_xN_y$ and/or the second top dielectric layer may be selected from the group consisting of $SiO_x$, $SiN_x$ and $SiO_xN_y$. For example, the first top dielectric may include $SiO_x$ and the second top dielectric layer may include $SiN_x$ or vice versa.

In embodiments in which the conductive floating gate 14 is encapsulated, the conductive floating gate 14 may be encapsulated by a first dielectric layer and a second dielectric layer, each including a compound selected from the group consisting of $SiO_x$, $SiN_x$ and $SiO_xN_y$. For example, the first dielectric layer may include $SiO_x$ and the second dielectric layer may include $SiN_x$ or vice versa.

In embodiments including three or more dielectric layers, the composition of the dielectric layers may alternate. For example, a stack including alternating layers of $SiO_x$ and $SiN_x$ may be provided. In some embodiments, the bandgap energies of the layers of the stack may alternate. In some embodiments including three dielectric layers, the centre dielectric layer may include a bandgap energy which is less than the bandgap energy of the contiguous dielectric layers.

The first and second bottom dielectric layers and first and second top dielectric layers may include a material of the same system, but with differing composition. For example, each of the dielectric layers may include a composition of the system $SiO_xN_y$ with differing oxygen contents.

The floating gate structure 10 according to any one of the embodiments may be used in enhancement mode transistor device, for example a Group III-nitride-based enhancement mode transistor device. The enhancement mode transistor device may include a Group III-nitride-based channel layer, a Group III-nitride-based barrier layer arranged on the Group III-nitride-based channel layer and forming a heterojunction therebetween, a source, a drain and a control gate. The source, the drain and the control gate may be arranged on the barrier layer. The floating gate structure may be arranged between the control gate and the barrier layer.

In an embodiment, the gate and the drain are electrically coupled to from an anode and the source forms a cathode. In this embodiment, an enhancement mode device having a basis transistor structure can be used as an enhancement mode diode device.

FIG. 2 illustrates an enhancement mode device in the form of a Group III-Nitride-based transistor device 20 including a floating gate structure 21. The Group III-Nitride-based transistor device 20 is an enhancement mode device if the floating gate structure is sufficiently charged.

The Group III-Nitride-based transistor device 20 includes an active semiconductor region 22 including a first Group III-Nitride-based layer 23 including gallium nitride (GaN) and a second Group III-Nitride-based layer 24 including aluminium gallium nitride ($Al_xGa_{(1-x)}N$) which is arranged on the first Group III-Nitride-based layer 23. An interface 25 is formed between the first Group III-Nitride-based layer 23 and the second Group III-Nitride-based layer 24. Due to the differing lattice constants and differing band gaps of the first Group III-Nitride-based layer 23 and the second Group III-Nitride-based layer 24, a two-dimensional gas (2DEG) channel 26 is formed in the upper region of the first Group III-Nitride-based layer 23 adjacent the interface 25.

The Group III-Nitride-based transistor device 20 further includes a source 27 and a drain 28 arranged on the upper surface 29 of the second Group III-Nitride-based layer 24. The source 27 and the drain 28 are electrically coupled to the 2DEG channel 26. The floating gate structure 21 is also arranged on the upper surface 29 of the second Group III-Nitride layer 24 laterally between the source 27 and the drain 28. In some embodiments, a third Group III-nitride-based layer is arranged on the second Group III-nitride-based layer 24 between the second Group III-nitride-based layer 24 and the floating gate structure 21. The second Group III-nitride-based laser 24 may include aluminium gallium nitride third Group III-nitride based layer may include GaN and may be used to avoid undesirable reaction with the underlying second Group III-nitride based layer 24 during further processing, for example oxidation of the aluminium gallium nitride.

The floating gate structure 21 includes a first bottom dielectric layer 30 arranged on the upper surface 29 of the second Group III-Nitride-based layer 24, a second bottom dielectric layer 31 arranged on the first bottom dielectric layer 30 and a conductive floating gate 32 arranged on the second bottom dielectric layer 31. An insulating layer 33 is arranged on the conductive floating gate 32 and a control gate 34 is positioned on the insulating layer 33. The conductive floating gate 32 is sandwiched between the second bottom dielectric layer 31 and the insulating layer 33.

The first bottom dielectric layer 30, the second bottom dielectric layer 31, the conductive floating gate 32, the insulating layer 33 and the control gate 34 are arranged in a stack in this order on the upper surface 29 of the second Group III-Nitride-based layer 24. Side faces 35 of the conductive floating gate 32 remain uncovered by the material forming the first bottom dielectric layer 30, the second bottom dielectric layer 31 and the insulating layer 33.

The Group III-Nitride-based transistor device 20 also includes an insulating region 36 extending from the upper surface 29 through the second Group III-Nitride-based layer 24 and into the first Group III-Nitride-based layer 23 at outermost side faces 37 of the active semiconductor region 22.

The floating gate structure 21 is positioned between the control gate 34 and the channel 26 in order to produce an enhancement mode transistor device 20 which is normally off, if the floating gate is sufficiently charged. If the floating gate structure 21 were to be removed, a depletion mode transistor would be formed that is normally on.

Without being bound by theory, the floating gate structure 21 may operate in the following manner. The conductive floating gate 32 is charged up, with electrons in the case of a channel including a 2 dimensional electron gas, thus removing charge carriers from the channel 26 so that there is no charge transport between the source 27 and the drain 28. In this state, the transistor device is off. The conductive floating gate 32 may be charged up by applying one or more additional electrical pulses which may be applied via the control gate 34, for example.

The first bottom dielectric layer 30 and the second bottom dielectric layer 31 are thought to prevent the electrons from flowing out from the conductive floating gate 32 into the channel 26 and the insulating layer 33 above the conductive floating gate 32 prevent electrons from floating into the control gate 34. This effect may be achieved by providing tailored bandgap offsets between the semiconductor material of the active semiconductor region 22, the material of the control gate 34 and the material of the bottom dielectric layers 30, 31. For example, the control gate 34 may include Polysilicon and the dielectric first bottom dielectric layer 30 and the second bottom dielectric layer 31 may include $SiO_x$.

Suitable selection of the dielectric material of the insulating layer 33 between the control gate 34 and the conductive floating gate 32 and of the bottom dielectric layers 30, 31 between the conductive floating gate 32 and the channel 26 and/or selection of a suitable geometry, for example the layer thickness, may assist in preventing electrons from entering the conductive floating gate 32 from and to the channel depending on the applied voltages.

The thickness of the bottom dielectric layers 30, 31 and of the insulating layer 33 may be greater than the tunnel distance of the charge carriers and may be at the same time small enough that the conductive floating gate 32 can be charged up with charge carriers in order that the electrons do not leak out of the conductive floating gate 32. The total thickness of the dielectric may lie between 3 nm and 100 nm, for example between 10 nm and 30 nm.

In some embodiments, at least one of the bottom dielectric layers 30, 31 positioned between the conductive floating gate 32 and the semiconductor material of the active semiconductor region 22 and between the conductive floating gate 32 and the control gate 34 may have a bandgap energy which is greater than the bandgap energy of the conductive floating gate 32 or greater than the bandgap energy of the conductive floating gate 32 and of the second Group III-Nitride-based layer 24 in order to produce a barrier for the electrons of 30 meV, 100 meV or 500 meV.

In some embodiments, the materials of the first bottom dielectric layer 30 and the second bottom dielectric layer 31 may have different bandgap energies, whereby each of these bandgap energies is greater than that of the material of the conductive floating gate 32 and in some embodiments, greater than the bandgap energy of the second Group III-Nitride-based layer 24.

Whilst the conductive floating gate 32 is charged up with electrons, the transistor device remains switched off if the gate voltage is negative or slightly positive. When the gate voltage is sufficiently positive so that the threshold voltage is reached or exceeded, for example 1 V, the transistor is switched on. The transistor may be switched off by reducing the voltage applied to the control gate 34.

The floating gate structure may vary from the structure illustrated in FIG. 2. For example, more than two bottom dielectric layers may be arranged between the upper surface 29 of the second Group III-Nitride layer 24 and the conductive floating gate 32 and two or more top dielectric layers may be arranged between the conductive floating gate 32 and the control gate 34. In some embodiments the conductive floating gate is encapsulated by two or more dielectric layers on all sides.

FIG. 3 illustrates an enhancement mode device 40 including a floating gate structure 41 in which a conductive floating gate 42 is encapsulated by a first dielectric layer 43 and a second dielectric layer 44. The enhancement mode device 40 includes a Group III-Nitride-based enhancement mode transistor device including a source 46, a drain 47 and a control gate 48 which is arranged laterally between the source 46 and the drain 47. The Group III-Nitride-based enhancement mode device 40 includes a first Group III-Nitride-based layer 49 including gallium nitride and a second Group III-Nitride-based layer 50 including aluminium gallium nitride which is arranged on the first Group III-Nitride-based layer 49.

A heterojunction 51 is formed at the interface between the first Group III-Nitride-based layer 49 on the second Group III-Nitride-based layer 50. Due to the differing band gap energies of the first Group III-Nitride-based layer 49 and the second Group III-Nitride-based layer 50, in particular the conduction band offsets and the polarity of the crystalline structure of the Group III-nitrides, a two-dimensional gas 52 is formed at the interface and, in particular, in the upper region of the first Group III-Nitride-based layer 49. The first Group III-Nitride-based layer 49 may be denoted as a channel layer and the second Group III-Nitride-based layer 50 may be denoted as a barrier layer.

The source 46, the floating gate structure 41 and the drain 47 are arranged on the upper surface 53 of the second Group III-Nitride-based layer 50. The conductive floating gate 42 is encapsulated on all sides by the second dielectric layer 44 and the second dielectric layer 44 is encapsulated on all sides 45 by the first dielectric layer 43. The control gate 48 is positioned on the upper surface 54 of the first dielectric layer 43. The conductive floating gate 42 is, therefore, arranged between the control gate 48 and the two-dimensional gas of the channel 52.

The Group III-Nitride-based enhancement mode device 40 is illustrated in FIG. 3 in a non-conducting or off state in which the conductive floating gate 42 is charged with electrons indicated schematically with the reference number 55. The two-dimensional gas 52 is, therefore, discontinuous between the source 46 and the drain 47 in regions under the conductive floating gate 42.

The enhancement mode device 40 may further include a third Group III-nitride-based layer arranged on the second Group III-nitride-based layer 50 between the second Group III-nitride-based layer 50 and the floating gate structure 42. The third Group III-nitride-based layer may extend over the area between the source 46 and the drain 47.

FIG. 4 illustrates a gallium nitride-based enhancement mode transistor device 60 in the form of a high electron mobility transistor (HEMT). The gallium nitride-based enhancement mode transistor device 60 includes a floating gate structure 61 arranged between a control gate 62 and an active semiconductor region 63. The gallium nitride-based enhancement mode transistor device 60 includes a substrate 64 including silicon, a nucleation layer 65 arranged on the upper surface of the substrate 64, a gallium nitride layer 66 which is formed on the nucleation layer 65 and an aluminium gallium nitride layer 67 arranged on the gallium nitride layer 66.

A two-dimensional gas 68 is formed in the upper region of the gallium nitride layer 66 due to the differing lattice constants and bandgaps of the gallium nitride layer 66 and the aluminium gallium nitride layer 67. The gallium nitride-based enhancement mode transistor device 60 includes a source 69 and a drain 70 arranged on the upper surface 71 of the aluminium gallium nitride layer 67 which are spaced apart from one another. The control gate 62 and the floating gate structure 61 are arranged in a stack between the source 69 and the drain 70 on the upper surface 71 of the aluminium gallium nitride layer 67.

The gallium nitride-based enhancement mode transistor device 60 includes a passivation layer 72 arranged on the upper surface 71 of the aluminium gallium nitride layer 67 which includes a recess 74 in which the floating gate structure 61 is arranged. The passivation layer 72 extends between the source 69 and the recess 74 and between the recess 74 and the drain 70. The base of the recess 74 is provided by a portion of the upper surface 71 of the aluminium gallium nitride layer 67.

The floating gate structure 61 includes a first dielectric layer 73 which includes silicon oxide ($SiO_x$). The first dielectric layer 73 extends from the source 69 over the passivation layer 72, over the base of the recess 74 in the passivation layer 72 to the drain 70. The floating gate structure 61 further includes a second dielectric layer 75 including silicon nitride ($SiN_x$) which also extends from the source 69 over the first dielectric layer 73 to the drain 70. The floating gate structure 61 further includes a conductive floating gate 76 including Polysilicon which is surrounded by a third dielectric layer 77. The third dielectric layer 77 includes silicon oxide formed by oxidation of the outermost region of the Polysilicon of the conductive floating gate 76.

The floating gate structure 61 further includes a fourth dielectric layer 78 which extends over the top face and side faces of the third dielectric layer 77 and which includes the same material as the second dielectric layer 75, i.e. silicon oxide. The floating gate structure 61 further includes a fifth dielectric layer 79 which extends over the fourth dielectric layer 78 and over the second dielectric layer 75. The conductive floating gate 76 is encapsulated on all sides by three dielectric layers.

The first dielectric layer 73 may include silicon oxide ($SiO_x$), the second dielectric layer 75 and the fourth dielectric layer 78 may include silicon nitride ($SiN_x$) and the fifth dielectric layer 79 may include silicon oxide ($SiO_x$). The compositions may be reversed such that the first dielectric layer 73 includes silicon nitride, the second dielectric layer 75 and the fourth dielectric layer 78 include silicon oxide and the fifth dielectric layer 79 includes silicon nitride.

The floating gate structure 61 may be fabricated by forming a recess 74 in the passivation layer 72, exposing the upper surface of the aluminium gallium nitride layer to form the base of the recess 74, depositing three dielectric layers conformally over the passivation layer 72 and the recess 74, removing the outermost dielectric layer by using the underlying second dielectric layer 75 as an etch stop, depositing a Polysilicon conductive floating gate 76 in the recess 74 and oxidising the outermost portion of the Polysilicon to produce the third dielectric layer 77, depositing a fourth dielectric layer 78 on the top surface and side faces of the conductive floating gate 76 and on the third dielectric layer 77 and by depositing a fifth dielectric layer 79 over the fourth dielectric layer 78 deposited on the conductive floating gate 76 and over the remaining first and second dielectric layers 73, 75 positioned adjacent the fourth dielectric layer 78.

The control gate 62 may then be deposited on the fifth dielectric layer 79 so that the floating gate structure 61 is sandwiched between the control gate 62 and the upper surface 71 of the aluminium gallium nitride layer 67. The dielectric layers 73, 75, 78, 79 are deposited conformally such that a peripheral recessed portion is formed in the recess 74 between the floating gate structure 61 and the passivation layer 72.

The gallium nitride-based enhancement mode transistor device 60 may further include a third Group III-nitride-based layer arranged on the second Group III-nitride-based layer 67 between the second Group III-nitride-based layer 67 and the floating gate structure 61. The third Group III-nitride-based layer may extend over the second Group III-nitride-based layer between the source 69 and the drain 70.

FIG. 5 illustrates a gallium nitride-based enhancement mode transistor 90 including a floating gate structure 91. The gallium nitride-based enhancement mode transistor 90 includes the active semiconductor region 63, the source 69, the drain 70 and the control gate 62 as in the embodiment illustrated in FIG. 4. Therefore, the general structure of the gallium nitride-based enhancement mode transistor 90 will not be described again.

The floating gate structure 91 fills the recess 74 in the passivation layer 72. Furthermore, the conductive floating gate 76 is positioned at least partially within the recess 74. The recess 74 and the upper surface of the passivation layer 72 are covered by a first dielectric layer 92 and a second dielectric layer 93 which is arranged on the first dielectric layer 92. The first dielectric layer 92 may include silicon oxide ($SiO_x$) and the second dielectric layer 93 may include silicon nitride ($SiN_x$). The side faces and lower face of the conductive floating gate 76 include a deposited third dielectric layer 94, such as a deposited silicon oxide ($SiO_x$). The upper face of the conductive floating gate 76 is covered by a fourth dielectric layer 95 including an oxide formed by oxidation of the Polysilicon material forming the conductive floating gate 76. The fourth dielectric layer 95 is covered by a fifth dielectric layer 96 in the form of silicon nitride. The second dielectric layer 93 and the fourth dielectric layer 95 are covered by a sixth dielectric layer 97. Therefore, the conductive floating gate 76 is surrounded on all three sides by three dielectric layers.

The third dielectric layer 94 and the fourth dielectric layer 95 may be separate layers or be provided as a single layer.

The control gate 62 is arranged on the sixth dielectric layer 97 so that the floating gate structure 61 and in particular the conductive floating gate 76 is sandwiched between the control gate 62 and the upper surface 71 of the aluminium gallium nitride layer 67.

The gallium nitride-based enhancement mode transistor device 90 may further include a third Group III-nitride-based layer arranged on the second Group III-nitride-based layer 67 between the second Group III-nitride-based layer 67 and the floating gate structure 61. The third Group III-nitride-based layer may extend over the second Group III-nitride-based layer between the source 69 and the drain 70.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An enhancement mode device, comprising:
   a floating gate structure, the floating gate structure comprising:
   a first bottom dielectric layer;
   a second bottom dielectric layer on the first bottom dielectric layer;
   a conductive floating gate on the second bottom dielectric layer;
   a Group III-nitride-based channel layer; and
   a Group III-nitride-based barrier layer arranged on the Group III-nitride-based channel layer,
   wherein a heterojunction is formed between the Group III-nitride-based barrier layer and the Group III-nitride-based channel layer.

2. The enhancement mode device according to claim 1, wherein the first bottom dielectric layer is arranged on an active semiconductor region.

3. The enhancement mode device according to claim 1, wherein the first bottom dielectric layer and the second bottom dielectric layer comprise different bandgap energies.

4. The enhancement mode device according to claim 1, wherein the bandgap energy of the first bottom dielectric layer is greater than the bandgap energy of the second bottom dielectric layer.

5. The enhancement mode device according to claim 1, further comprising at least one further bottom dielectric layer arranged between the second bottom dielectric layer and the conductive floating gate.

6. The enhancement mode device according to claim 1, further comprising at least one insulating layer arranged on the conductive floating gate.

7. The enhancement mode device according to claim 6, further comprising a control gate arranged on the insulating layer.

8. The enhancement mode device according to claim 6, wherein the insulating layer comprises at least a first top dielectric layer and a second top dielectric layer having different bandgap energies.

9. The enhancement mode device according to claim 8, wherein the first top dielectric layer is selected from the group consisting of $SiO_x$, $SiN_x$ and $SiO_xN_y$.

10. The enhancement mode device according to claim 8, wherein the second top dielectric layer is selected from the group consisting of $SiO_x$, $SiN_x$ and $SiO_xN_y$.

11. The enhancement mode device according to claim 1, wherein the conductive floating gate is encapsulated.

12. The enhancement mode device according to claim 11, wherein the conductive floating gate is encapsulated by the first bottom dielectric layer and by the second bottom dielectric layer.

13. The enhancement mode device according to claim 11, wherein the conductive floating gate is encapsulated by the first top dielectric layer and the second top dielectric layer.

14. The enhancement mode device according to claim 1, wherein side faces of the conductive floating gate are covered by at least one side dielectric layer.

15. The enhancement mode device according to claim 1, wherein the enhancement mode device comprises an enhancement mode transistor device.

16. The enhancement mode device according to claim 1, wherein the first bottom dielectric layer is selected from the group consisting of $SiO_x$, $SiN_x$ and $SiO_xN_y$.

17. The enhancement mode device according to claim 1, wherein the second bottom dielectric layer is selected from the group consisting of $SiO_x$, $SiN_x$ and $SiO_xN_y$.

18. The enhancement mode device according to claim 1, further comprising a source, a drain and a control gate, wherein the source, the drain and the control gate are arranged on the Group III-nitride-based barrier layer and the floating gate structure is arranged between the control gate and the Group III-nitride-based barrier layer.

19. The enhancement mode device according to claim 1, wherein the enhancement mode device is a Group III nitride transistor.

20. An enhancement mode transistor device, comprising:
   a Group III-nitride-based channel layer;
   a Group III-nitride-based barrier layer arranged on the Group III-nitride-based channel layer and forming a heterojunction therebetween;
   a source;
   a drain;
   a control gate; and
   a floating gate structure,
   wherein the source, the drain and the control gate are arranged on the barrier layer and the floating gate structure is arranged between the control gate and the barrier layer, wherein the floating gate structure comprises:
   a first bottom dielectric layer;
   a second bottom dielectric layer on the first bottom dielectric layer; and
   a conductive floating gate on the second bottom dielectric layer.

21. The enhancement mode transistor device according to claim 20, wherein the gate and the drain are electrically coupled to from an anode and the source forms a cathode.

22. An enhancement mode device, comprising:
   a floating gate structure, the floating gate structure comprising:
   a first bottom dielectric layer;
   a second bottom dielectric layer on the first bottom dielectric layer; and
   a conductive floating gate on the second bottom dielectric layer,
   wherein the conductive floating gate is encapsulated by the first bottom dielectric layer and by the second bottom dielectric layer.

23. An enhancement mode device, comprising:
   a floating gate structure, the floating gate structure comprising:
   a first bottom dielectric layer;
   a second bottom dielectric layer on the first bottom dielectric layer; and
   a conductive floating gate on the second bottom dielectric layer,
   wherein the conductive floating gate is encapsulated by the first top dielectric layer and the second top dielectric layer.

* * * * *